United States Patent
Yamada et al.

(10) Patent No.: US 10,720,552 B2
(45) Date of Patent: Jul. 21, 2020

(54) LIGHT EMITTING DEVICE

(71) Applicant: NICHIA CORPORATION, Anan-shi, Tokushima (JP)

(72) Inventors: Yuichi Yamada, Anan (JP); Motokazu Yamada, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/608,791

(22) Filed: May 30, 2017

(65) Prior Publication Data

US 2017/0345974 A1  Nov. 30, 2017

(30) Foreign Application Priority Data

May 31, 2016 (JP) .................... 2016-108389

(51) Int. Cl.
*H01L 33/44* (2010.01)
*H01L 33/46* (2010.01)
(Continued)

(52) U.S. Cl.
CPC .............. *H01L 33/44* (2013.01); *H01L 33/38* (2013.01); *H01L 33/46* (2013.01); *H01L 33/508* (2013.01); *H01L 33/54* (2013.01); *H01L 33/62* (2013.01); *H01L 33/20* (2013.01); *H01L 33/26* (2013.01); *H01L 33/405* (2013.01); *H01L 33/60* (2013.01); *H01L 2224/48091* (2013.01);
(Continued)

(58) Field of Classification Search
CPC ..... H01L 2224/48091; H01L 2924/181; H01L 33/54; H01L 33/20; H01L 33/38
See application file for complete search history.

(56) References Cited

U.S. PATENT DOCUMENTS 8,459,832 B2 * 6/2013 Kim .................... F21V 9/30
362/231
9,299,895 B1 * 3/2016 Hsing Chen ........... H01L 33/54
(Continued)

FOREIGN PATENT DOCUMENTS

JP  2002-033517 A   1/2002
JP  2004-265985 A   9/2004
(Continued)

OTHER PUBLICATIONS

Search Report dated Sep. 27, 2017 in corresponding United Kingdom patent application No. 1708592.9.

*Primary Examiner* — Joseph L Williams
*Assistant Examiner* — Jacob R Stern
(74) *Attorney, Agent, or Firm* — Foley & Lardner LLP (57) ABSTRACT

A light emitting device includes: a substrate; a light emitting element disposed on the substrate, the light emitting element having an upper surface and a lateral surface; a reflecting layer located on the upper surface of the light emitting element; a first light-transmissive member having a first surface in contact with the lateral surface of the light emitting element, and a second surface that is inclined toward the substrate in a direction outward from the light emitting element; and a second light-transmissive member in contact with the second surface and covering the light emitting element. A refractive index of the first light-transmissive is smaller than a refractive index of the second light-transmissive member.

11 Claims, 5 Drawing Sheets

(51) Int. Cl.
   *H01L 33/38*   (2010.01)
   *H01L 33/50*   (2010.01)
   *H01L 33/54*   (2010.01)
   *H01L 33/62*   (2010.01)
   *H01L 33/20*   (2010.01)
   *H01L 33/26*   (2010.01)
   *H01L 33/40*   (2010.01)
   *H01L 33/60*   (2010.01)

(52) U.S. Cl.
   CPC ............... *H01L 2224/8592* (2013.01); *H01L 2924/181* (2013.01); *H01L 2933/0016* (2013.01)

(56) References Cited

U.S. PATENT DOCUMENTS

| | | | |
|---|---|---|---|
| 2006/0083000 A1 | 4/2006 | Yoon et al. | |
| 2007/0138494 A1* | 6/2007 | Pugh | G02B 6/0021 257/98 |
| 2009/0200570 A1* | 8/2009 | Mori | H01L 33/642 257/99 |
| 2009/0279312 A1 | 11/2009 | Yoon et al. | |
| 2011/0242820 A1 | 10/2011 | Yoon et al. | |
| 2012/0075883 A1* | 3/2012 | Chen | G02B 6/002 362/607 |
| 2014/0042897 A1* | 2/2014 | Kamada | H01L 33/44 313/502 |
| 2014/0043831 A1 | 2/2014 | Yoon et al. | |

FOREIGN PATENT DOCUMENTS

| | | |
|---|---|---|
| JP | 2006-114863 A | 4/2006 |
| JP | 2010-147040 A | 7/2010 |
| JP | 2011-014555 A | 1/2011 |
| JP | 2011-114093 A | 6/2011 |
| JP | 2014-075571 A | 4/2014 |
| RU | 2133068 C1 | 7/1997 |

* cited by examiner

LIGHT EMITTING DEVICE

CROSS-REFERENCE TO RELATED APPLICATION

The present application claims priority under 35 U.S.C. § 119 to Japanese Patent Application No. 2016-108389, filed May 31, 2016. The contents of this application are incorporated herein by reference in their entirety.

BACKGROUND

The present disclosure relates to a light emitting device.

In recent years, various electronic components have been proposed and come into practical use, and higher performance is required for those components. For example, applications for backlights of liquid crystal displays and for general lighting, appearance is highly valued, and there have been high demands for further thinner type and downsizing of the light emitting device.

For example, Japanese Unexamined Patent Application Publication No. 2006-114863 discloses a light emitting device in which a secondary lens is combined with an LED. Thus, light can be dispersed uniformly in a short irradiating distance, allowing for a reduction in the thickness of the device.

SUMMARY

However, in combining an LED and a lens, when light reflected at an interface between the lens and air layer, and/or direct light from the LED is incident on a light-diffusing and reflecting part provided on an upper surface of the substrate located under the lens, luminous intensity in a substantially upward direction with respect to the substrate increases due to an emission in upper surface directions of the lens caused by scattering of the light. For this reason, sufficient decrease in the luminous intensity in the substantially upward direction may not be obtained, which may result in failure to achieve desired light distribution properties.

Certain embodiments of the present invention can provide a light emitting device in which the amount of light leaking in the upper surface directions can be reduced and desired light distributing properties can be achieved.

A light emitting device according to one embodiment includes a substrate, a light emitting element having a lateral surface mounted on the substrate and having a reflecting layer on its upper surface, a first light-transmissive member having a first surface being in contact with the lateral surface of the light emitting element and a second surface tapering toward the substrate as separating from the light emitting element, and a second light-transmissive member covering the light emitting element. The first light-transmissive member has a smaller refractive index than the second light-transmissive member.

In the light emitting device according to certain embodiments of the present invention, the amount of light leaking in the upper surface direction can be reduced and desired light distributing properties can be achieved.

DETAILED DESCRIPTION

Embodiments of the present invention will be described below with reference to the accompanying drawings. It is to be noted that the light emitting device described below is intended for implementing the technical concept of the present invention, and the present invention is not limited to those described below unless otherwise specified. The sizes and the positional relationships of the members in each of the drawings are occasionally shown exaggerated for ease of explanation.

First Embodiment

Figure 1:
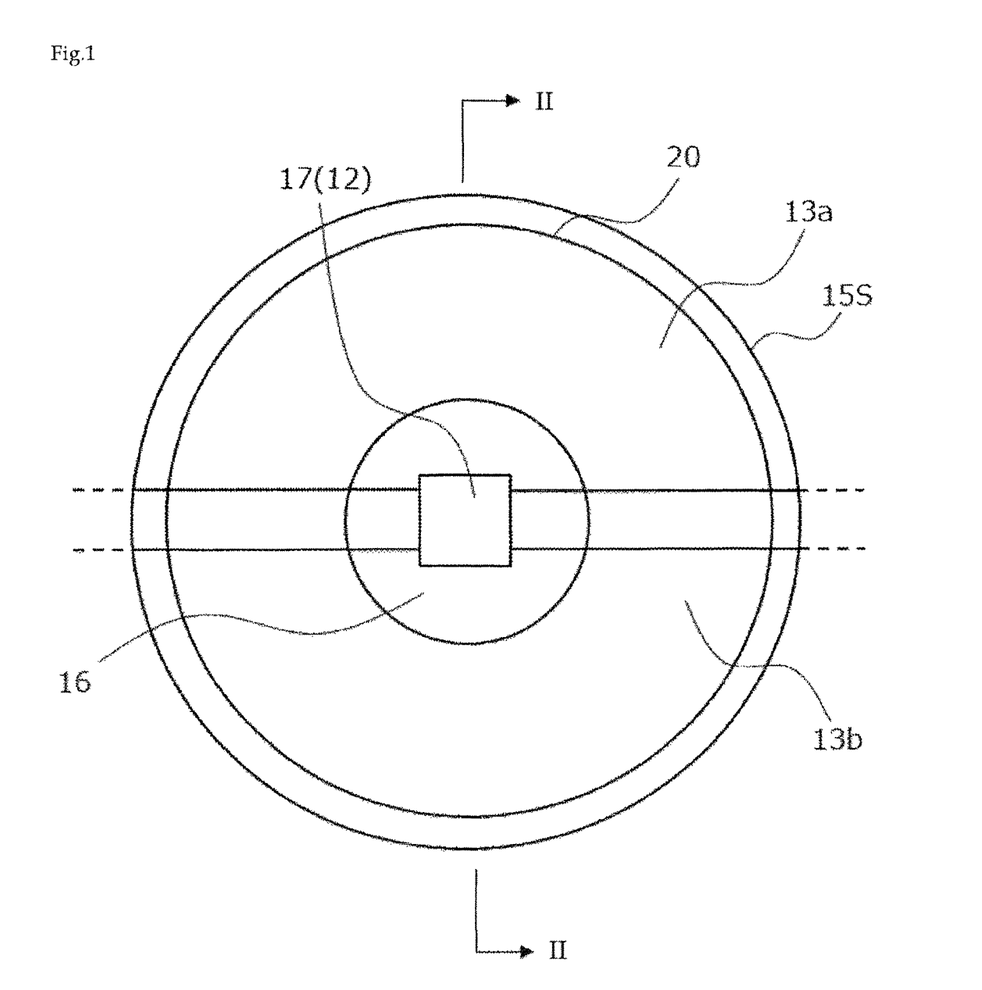
FIG. 1 is a schematic bottom view of a light emitting device according to a first embodiment of the present invention.
Figure 2:
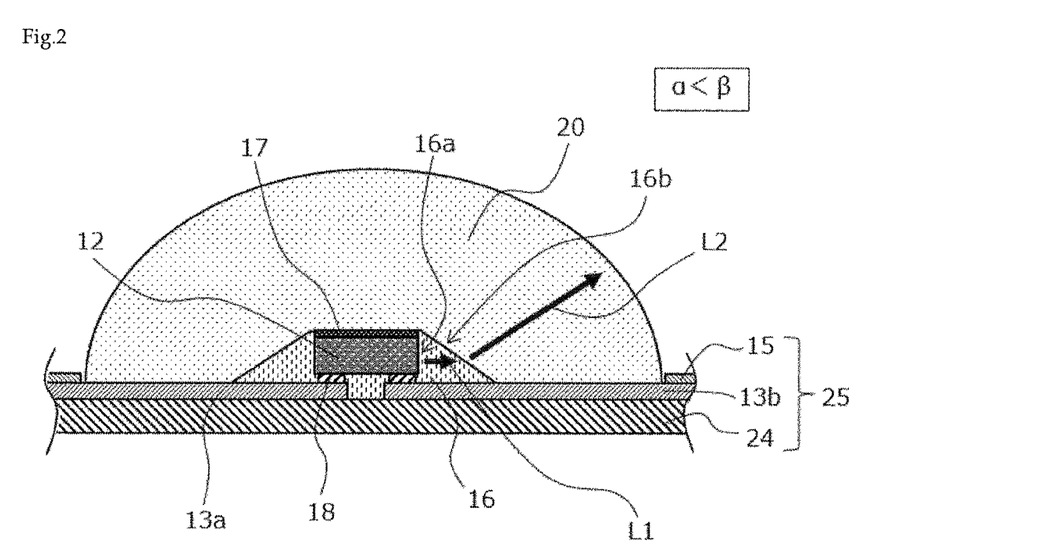
FIG. 2 is a cross sectional view taken along line II-II in FIG. 1.

FIG. 1 is a schematic top view of a light emitting device according to a first embodiment. FIG. 2 is a schematic cross-sectional view of the light emitting device taken along line II-II of FIG. 1. The light emitting device includes a substrate 25, a light emitting element 12 disposed on the substrate 25 and having an upper surface on which a reflecting layer 17 is provided, a first light-transmissive member 16, and a second light-transmissive member 20. The first light-transmissive member 16 includes a first surface 16a in contact with a lateral surface of the light emitting element 12, and a second surface 16b that is inclined so as to become closer to the substrate 25 in an outward direction from the light emitting element 12. The second light-transmissive member 20 is in contact with the second surface 16b of the first light-transmissive member 16, and covers the light emitting element 12. A refractive index α of the first light-transmissive member 16 is smaller than a refractive index β of the second light-transmissive member 20.

1. Structure of Substrate 25

The substrate 25 includes, for example, as shown in FIG. 2, a base body 24, wiring parts 13a and 13b, and a protective layer 15. The substrate 24 is made of an insulating material, examples thereof include, insulating resins such as glass epoxy, bismaleimide triazine, polyimide (PI), polyethylene naphthalate (PEN), and polyethylene terephthalate (PET), ceramics such as alumina. The base body 24 may be made of a copper foil or aluminum foil which is covered with an insulating resin. The base body 24 may have a thickness in a range of, for example, about 10 μm to about 100 μm.

The wiring parts 13a and 13b are arranged on a main surface of the base body 24. The wiring parts 13a and 13b are arranged spaced apart from each other. The wiring parts 13a and 13b as described above are made of, for example, a metal film such as a copper foil or an aluminum foil. The wiring parts 13a and 13b may have a thickness in a range of, for example, about 10 μm to about 60 μm. When a flexible the base body 24 is used, the wiring parts 13a and 13b have a thickness which does not impair the flexibility of the substrate 25, and for example, a thickness in a range of 8 μm to 150 μm is preferable.

In the first embodiment, the substrate 10 includes a pair of wiring parts 13a and 13b, but is not limited thereto. The substrate 25 at least includes a pair of wiring portions, but may include three or more wiring parts. In this case, the light emitting elements 12 may be arranged over three or more wiring parts.

The protective layer 15 covers the surfaces of the base member 24 and the wiring parts 13a, 13b. Thus, the protective layer 15 covers approximately the entire upper surface of the substrate 25 except for the opening portions 15S to be described below. Such a reflective layer 15 is made of a material adapted to reflect the emitted light (including the wavelength-converted light by a wavelength converting member) from the light emitting element 12. As an example of the material of the protective layer 15, an insulating white ink (i.e., a white resist) made of a silicone-based resin containing titanium oxide can be preferably used.

The protective layer 15 defines an opening 15S at least in and around the region where the light emitting element 12 to be arranged. FIG. 1 shows an opening 15S formed in a portion including portions of the wiring parts 13a and 13b. As shown in FIG. 2, parts of the two wiring parts 13a and 13b are exposed in the opening 15S.

The openings 15S can be formed in an appropriate shape such as a circular shape or a quadrangular shape adapted to surround the light emitting element 12 in a plan view. In FIG. 1, the opening 15S is formed in a circular shape. After the light emitting element 12 is mounted in the opening 15S, the opening 15S is covered by the first light-transmissive member 16. The opening 15S may be covered by the first light-transmissive member 16, or by both the first light-transmissive member 16 and a second light-transmissive member 20.

The size of the opening 15S allows a region for electrically connecting to the electrodes of the light emitting element 12. For example, a peripheral defining the opening 15S is preferably located at about 50 to 2000 μm outer side with respect to each side of outline of the light emitting element 12 in a plan view. In the first embodiment, the opening 15S is defined outward of an outer periphery of the second light-transmissive member 20.

Also, the protective layer 15 may be disposed extending below the light emitting element 12 with the openings 15S smaller than the shape in a plan view of the light emitting elements 12. The protective layer 15 may be disposed to surround a bonding member 18 connecting the light emitting element 12 and the substrate 25 so that the opening is not substantially formed.

The wiring parts 13a and 13b also serve as the terminal portions, which are connected to external wirings that are connected to an external power source. The terminal portions are preferably formed at an end portion at the main surface-side of the base member 25, and the external wirings may be connected to a known connectors disposed on the substrate 25.

2. Configuration of Light Emitting Element 12

The light emitting element 12 is disposed on the substrate 25. As shown in FIG. 1, when the base member 25 includes the protective layer 15, the light emitting element 12 is arranged in the opening 15S defined in the protective layer 15.

The light emitting element 12 has a reflecting layer 17 on its upper surface. The reflecting layer 17 is adapted to reflect light from the light emitting element 12. With the reflecting layer 17, light emitted from the light emitting element 12 can be emitted in lateral directions from the surfaces of the light emitting element 12 where the reflecting layer 17 is not formed. Accordingly, an amount of light directly over the light emitting element 12 can be reduced and a batwing light distributing properties can be obtained. When the reflecting layer 17 is disposed directly on the light emitting element 12, a primary lens and/or a secondary lens becomes unnecessary, which allows for a reduction in the thickness of the light emitting device compared to the case where a batwing light distribution is obtained by the use of a primary lens and/or a secondary lens.

The reflecting layer 17 is adapted to reflect light from the light emitting element 12. For example, the reflecting layer 17 preferably can reflect 70% or greater, more preferably 80% or greater, of light emitted from the light emitting element 12. For example, the reflecting layer 17 may be made of a metal film, or may be made of a dielectric multilayer film (DBR film).

The reflecting layer 17 preferably has an incident angle dependence of reflectance for a light emission wavelength of the light emitting element 12. More specifically, the reflecting layer 17 preferably has a reflectance smaller to oblique incident light than to perpendicularly incident light. With this arrangement, moderate change in the luminance directly above the light emitting element can be obtained, so that occurrence of an extremely dark portion such as a dark spot directly above the light emitting element can be sufficiently reduced.

In the embodiment, each of the light emitting elements 12 is, as shown in FIG. 2, mounted on the substrate 25 in a flip-chip manner. The light emitting element 12 is connected to the wiring parts 13a and 13b via corresponding bonding members 18 respectively. The bonding member 18 can be made of, for example, a solder such as a Sn—Ag—Cu based alloy, a Au—Sn based alloy, a Sn—Cu based alloy, a metal such as Au, an anisotropic conductive paste, or an Ag paste.

The light emitting element 12 includes, for example, an n-type layer, an active layer, and a p-type layer, which are stacked in order on a light-transmissive sapphire substrate. The n-type layer, the active layer and the p-type layers can be made of, for example, gallium nitride-based semiconductors. The n-side electrode connected to the n-type layer and the p-side electrode connected to the p-type layer are electrically connected to corresponding wiring parts 13 and 13 via respective bonding members 18.

3. Configuration of First Light-Transmissive Member 16 and Second Light-Transmissive Member 20

In the present embodiment, the use of the first light-transmissive member 16 and the second light-transmissive member 20 allows for changing of light extracting direction of light emitted from the light emitting element 12 that has the reflecting layer 17, and obtaining an improvement in the light extraction efficiency.

The first light-transmissive member 16 configured to receive light emitted in lateral directions from the light emitting element 12 is arranged in contact with the lateral surfaces of the light emitting element 12. The surface of the first light emitting element 16 in contact with the lateral surfaces of the light emitting element 12 will be indicated as a first surface 16a. Further, the first light-transmissive member 16 has a second surface 16b that tapers toward the upper substrate 25 in a direction outward from the light emitting element 12 (in other words, the first light-transmissive member 16 has a thickness decreasing in a direction outward from the light emitting element 12). The second surface 16b is sloped with respect to the substrate 25 or to the surfaces of the wiring parts 13a, 13b.

The upper surface of the light emitting element 12, that is, the upper surface of the reflecting layer 17, is exposed from the first light-transmissive member 16. The lateral surfaces of the reflecting layer 17 are covered by the first light-transmissive member 16. The first light-transmissive member 16 may be arranged so as to cover an entirety of the light emitting element 12 provided with the reflecting layer 17.

The first light-transmissive member 16 preferably has a circular outline shape in a top view, as shown in FIG. 1. In this case, as shown in FIG. 1, the first light-transmissive member 16 is preferably arranged to surround the light emitting element 12 such that the light emitting element 12 is approximately centered in the first light-transmissive member 16.

The second light-transmissive member 20 is arranged on the substrate 25, is in direct contact with the second surface 16b of the first light-transmissive member 16, and indirectly or directly covers the light emitting element 12. The second light-transmissive member 20 may have a cylindrical shape, a hemisphere shape, or the like.

The second light-transmissive member 20 may be disposed, as shown in the plan view of FIG. 1, so as to cover the entire upper surface of the first light-transmissive member 16 and to be larger than the first light-transmissive member 16. In this case, the second light-transmissive member 20 covers the upper surface of the substrate 25 at the outer periphery of the first light-transmissive member 16, without the first light-transmissive member 16 interposed therebetween. For example, in a plan view, the outermost end of the second light-transmissive member 20 is preferably located about 50 to 1000 μm outward of the outer end of the first light-transmissive member 16.

In the present embodiment, the refractive index $\alpha$ of the first light-transmissive member 16 is smaller than the refractive index $\beta$ of the second light-transmissive member 20. In the present specification, the term "refractive index" refers to a refractive index to the emission wavelength of the light emitting element 12. When $\alpha<\beta$, as shown by arrows in FIG. 2, light emitted in a lateral direction of the light emitting element 12 enters the first light-transmissive member 16 from the first surface 16a and propagates toward an interface between the second surface 16b of the first light-transmissive member 16 and the second light-transmissive member 20. The light L1 propagating from the first light-transmissive member 16 to the second light-transmissive member 20 is propagating from a medium having a smaller refractive index to a medium having a larger refractive index. Thus, total reflection will not occur at the interface between the first light-transmissive member 16 and the second light-transmissive member 20. The second surface 16b of the second light-transmissive member 16, that is, an interface between the first light-transmissive member 16 and the second light-transmissive member 20, is sloped, tapering toward the substrate 25 in a direction outward from the light emitting element 12, so that the light reflected at the interface L2 will be directed upward.

With this arrangement, the amount of light leaking in the upper surface direction can be reduced by the reflecting layer 17 and the light extraction efficiency can be improved. As described above, in order to refract light in an upward direction, most of light emitted from the light emitting element 12 is preferably directed to pass through the first light-transmissive member 16, so that all the lateral surfaces of the light emitting element 12 are preferably covered by the first light-transmissive member 16.

Figure 3:
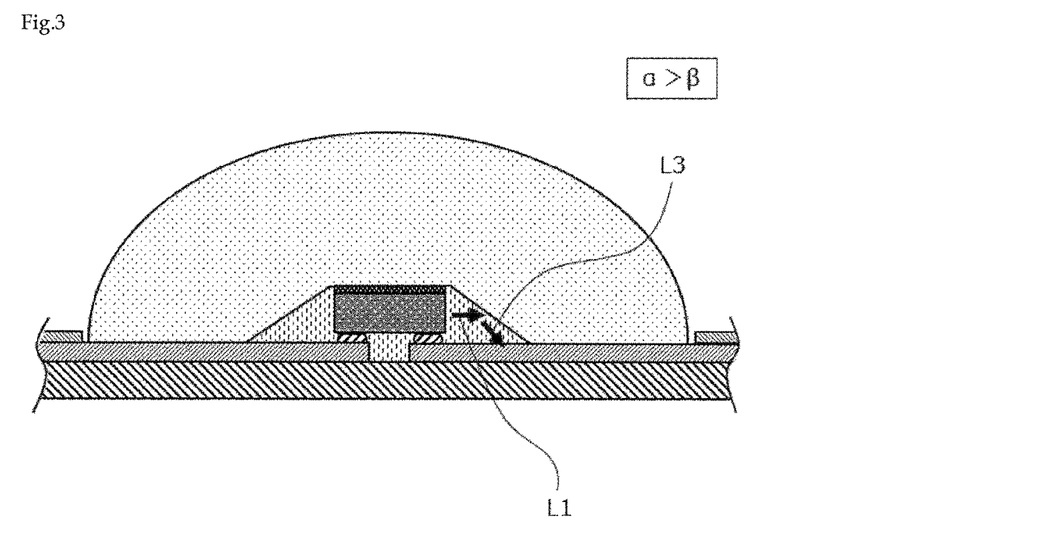
FIG. 3 is a schematic diagram illustrating a state of light extracting when the relationship of refractive indices is different from that in the first embodiment.

FIG. 3 illustrates a state of extracting of light from the light emitting element 12 when $\alpha>\beta$ is satisfied. The light emitted in a lateral direction of the light emitting element 12 enters the first light-transmissive member 16 from the first surface 16a and propagates toward an interface between the second surface 16b of the first light-transmissive member 16 and the second light-transmissive member 20. The light L1 propagating from the first light-transmissive member 16 to the second light-transmissive member 20 is propagating from a medium having a larger refractive index to a medium having a smaller refractive index. Thus, total reflection will occur at the interface between the first light-transmissive member 16 and the second light-transmissive member 20. In particular, when light is emitted from a lateral surface of the light emitting element 12, light L1 tends to enter the second surface 16b at an angle greater than a critical angle. Thus, a large amount of light is totally reflected toward the substrate 25 side, as shown in the arrow L3 in FIG. 3, and may be absorbed by the substrate 25, which may result in a reduction of the light extraction efficiency.

Also, in order to reduce optical absorption by the substrate 25, for example, increasing the reflectance of the wiring parts 13a, 13b, and/or employing a light-reflecting protective layer 15 to extract totally-reflected light, luminous intensity in directly upper direction of the light emitting element 12 is increased by scattering of light, and the effect of the reflecting layer 17 decreases.

Figure 4:
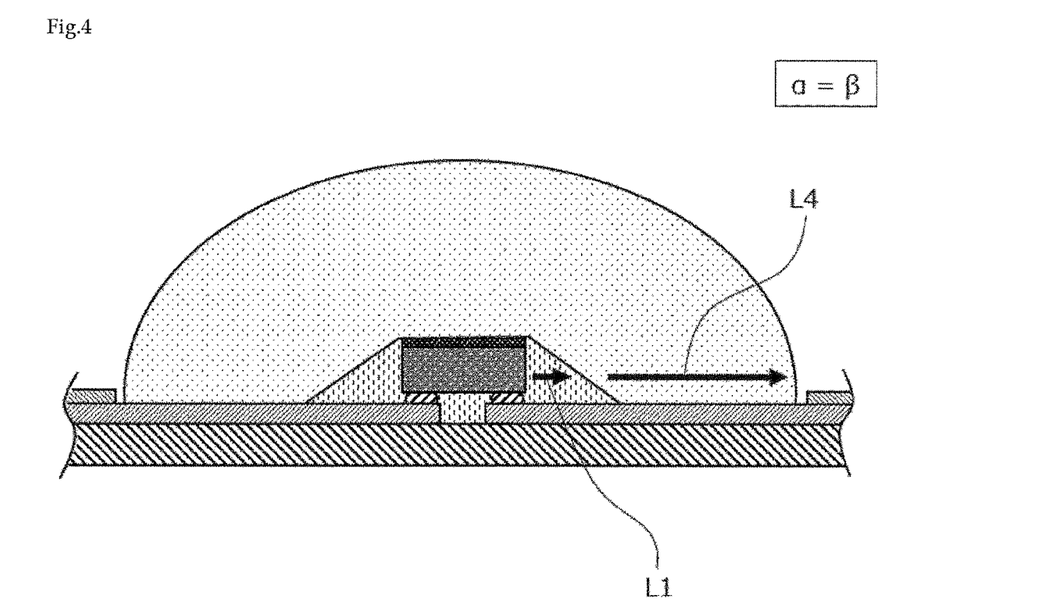
FIG. 4 is a schematic diagram illustrating a state of light extracting when the relationship of refractive indices is different from that in the first embodiment.

FIG. 4 illustrates a state of extracting of light from the light emitting element 12 when $\alpha=\beta$ is satisfied. In this case, total reflection at the interface between the first light-transmissive member 16 and the second light-transmissive member 20 does not occur. Refracting of light at the interface also does not occur, so that light L4 enters the second light-transmissive member 20 and propagates in the second light-transmissive member 20 while retaining the incident angle. When a plurality of light sources are aligned and used, light emitted in a direction of the alignment enters the adjacent light source and may be absorbed. Thus, in the embodiment described above, light emitted in a lateral direction should be directed in an upward direction by refracting the light at the interface between the first light-transmissive member 16 and the second light-transmissive member 20.

Figure 6:
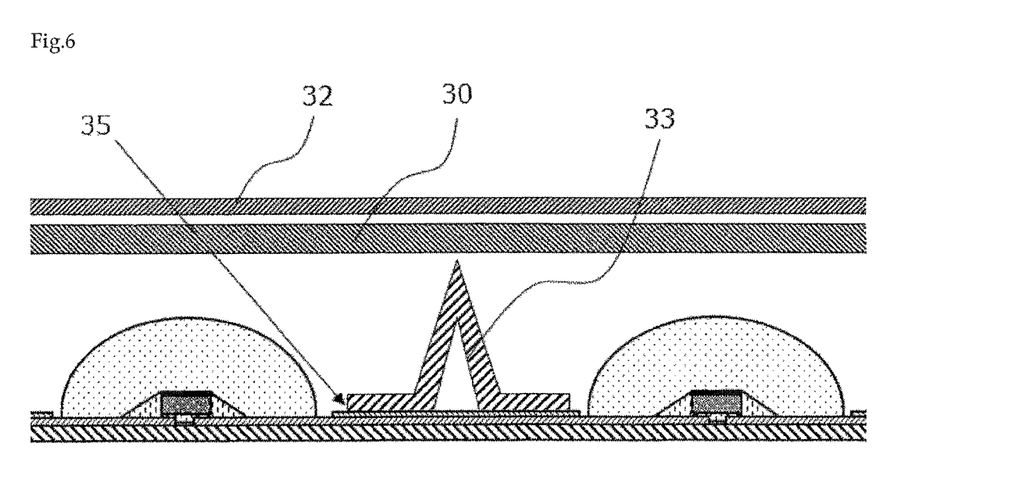
FIG. 6 is a schematic cross-sectional view showing an example of a surface light emitting device according to one embodiment.

When a reflecting member 33 that can reflect light emitted in a lateral direction is arranged to be lateral of the light emitting element 12 as shown in FIG. 6, due to a thickness of the reflecting member 33, light that hits an end portion 35 of the reflecting member 33 is scattered to increase the luminous intensity in directly upper direction of the light emitting element 12, and the effect of the reflecting layer 17 decreases. Thus, in the present embodiment described above, light emitted in a lateral direction can be directed in an upward direction by refracting the light at the interface between the first light-transmissive member 16 and the second light-transmissive member 20.

Taking the extraction of light from the light emitting element 12 to the first light-transmissive member 16 into consideration, for example, a refractive index of a light emitting element 12 that includes a sapphire substrate is generally higher than a refractive index of a light emitting element 12 that includes a resin substrate. In such a case, in order to increase the light extraction efficiency from the light emitting element 12, a smaller difference in the refractive indices of the light emitting element 12 and the first light-transmissive member 16 is preferable. In the present embodiment, when the first light-transmissive member 16 and the second light-transmissive member 20 are respectively made of resin material, the difference in the refractive indices of the light emitting element 12 and the second light-transmissive member 20 is greater than the difference in the refractive indices of the light emitting element 12 and the first light-transmissive member 16. This may result in a low light extraction efficiency from the light emitting element 12 to the first light-transmissive member 16, but according to the present embodiment, optical absorption by the substrate 25 can be reduced, so that the light extraction efficiency to the outside of the second light-transmissive member 20 (where air exists) can be increased.

The refractive index can be measured with, for example, an Abbe refractometer. When the refractive index cannot be measured with the Abbe refractometer, due to the size of the member or the like, the refractive index can be measured by determining the material of the member and measuring a similar member of the same material to obtain the refractive index of the member.

The first light-transmissive member 16 and the second light-transmissive member 20 are preferably resin members. When using a resin material, a material having a desired refractive index can be selected. Examples of the resin material include an epoxy resin material, a urea resin material, a silicone resin material, a fluororesin material, and a hybrid resin material that contains at least one of those resin materials. The first light-transmissive member 16 and the second light-transmissive member 20 do not substantially contain any materials that disturb the straight-line propagation of light. In order to adjust the viscosity of resin, a material such as a nano-filler material that barely produces scattering of light may be contained in the light-transmissive members 16, 20.

Other than the resin materials described above, a material satisfying the relationship of the refractive indices α<β, such as a light-transmissive glass material may be used for the first light-transmissive member 16 and the second light-transmissive member 20. In this case, the first light-transmissive member 16 and the second light-transmissive member 20 may be made of different materials, such that the first light-transmissive member 16 may be made of a resin material and the second light-transmissive member 20 may be made of a glass material.

Second Embodiment

Figure 5:
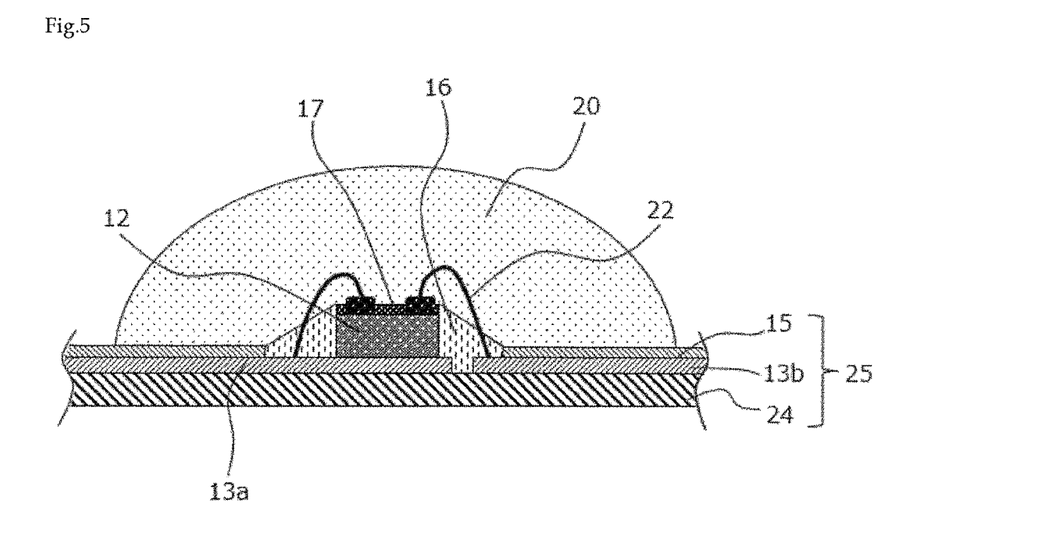
FIG. 5 is a schematic bottom view of a light emitting device according to a second embodiment of the present invention.

In a light emitting device according to a second embodiment, the light emitting element 12 is not flip-chip mounted but the light emitting element 12 is mounted on an upper surface of the substrate 25.

The light emitting element 12 according to the second embodiment is, as shown in FIG. 5, mounted so that the p-side electrode and the n-side electrodes are located above the light emitting element 12, and the electrodes are electrically connected to the wiring parts 13a, 13b via wires 22 respectively. The surface of the light emitting element 12 having the electrodes is provided with a reflecting layer 17. For example, portions of the electrodes may be masked and the reflecting layer 17 may be disposed on other unmasked portions, or a reflecting layer 17 may be disposed with approximately a flat upper surface via a protective layer and the electrodes may be provided on the reflecting layer 17. In the second embodiment, the protective layer 15 defining an opening 15S is disposed so that the opening 15S is located inward of the end portion of the second light-transmissive member 20.

The first light-transmissive member 16 is arranged at the lateral surfaces of the light emitting element 12 as in the first embodiment, and connecting portions of the wires 22 and the wiring parts 13a and 13b are covered by the first light-transmissive member 16. The connecting portions of the wires 22 and the light emitting element 12 are covered by the second light-transmissive member 20. Other configurations may be similar to that in the first embodiment, and similar effects can be obtained.

Next, configurations and members that can be used in the first embodiment and the second embodiment will be described.

Surface Light-Emitting Device

Figure 7:
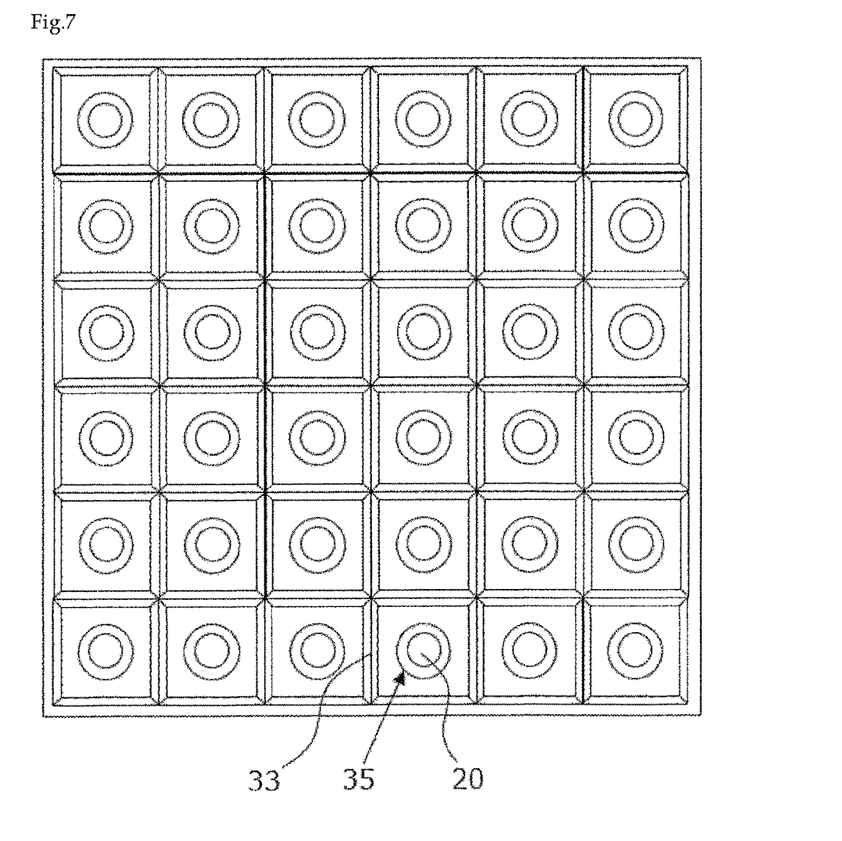
FIG. 7 is a schematic top view showing an example of light emitting device according to one embodiment.

The light emitting device according to the second embodiment preferably includes a plurality of the light emitting devices shown in FIG. 1 and FIG. 5 disposed on a single substrate. Accordingly, a surface light source with little luminance unevenness can be formed. A light diffusing plate or a wavelength-converting sheet may be provided on the surface light source. As examples, surface light-emitting device are shown in FIG. 6 and FIG. 7.

FIG. 6 is a schematic cross-sectional view showing a surface light-emitting device including the light emitting devices according to the first embodiment. The light emitting devices illustrated in the first embodiment are mounted on a common substrate 25 with predetermined intervals, and the reflecting member 33 is arranged between adjacent light emitting devices. That is, the surface light-emitting device is provided with a plurality of light emitting devices of the first embodiments, and a reflecting member 33 that can reflect light from the light emitting element 12 is arranged on each region of the substrate 25 exposed from the second light-transmissive member 20 between the light emitting devices. A height of the reflecting members 33 is greater than the heights of the second light-transmissive members 20. Further, a light diffusing plate 30 for diffusing light from the light emitting devices is placed over the reflecting members 33, so that the light diffusing plate 30 is approximately parallel to the upper surfaces of the light emitting elements 12. Moreover, a wavelength converting layer 32 that is configured to convert the wavelength of a portion of light into different wavelength is arranged approximately in parallel to and above the light diffusing plate 30.

Generally, the smaller the ratio of the distance between the substrate 25 and the light diffusing plate 30 (which hereinafter may also be referred to as an optical distance OD) to the interval of the light emitting elements (which hereinafter may also be referred to as Pitch), i.e., OD/Pitch, the smaller the luminous intensity between the light emitting devices on the light diffusing plate 30, resulting in occurrence of dark portions on the light diffusing plate 30. However, with the reflecting members 33 arranged as in the second embodiment, the luminous intensity between the light emitting devices can be compensated by the reflecting members 33. Thus, even in a region having small OD/Pitch, luminance unevenness on the light diffusing plate 33 can be reduced. A material that can at least reflect the emission wavelength of the light emitting element 12 can be used for the material of the reflecting member 33. For example, a metal plate or a resin material containing a white filler can be suitably used.

The height of the reflecting member 33 and the tilting angle of the light-reflecting surface with respect to the surface of the substrate 25 can be appropriately determined.

The reflecting surface may be a flat surface or a curved surface, which can be selected to obtain desired light distributing properties. The height of the reflecting member 33 may be 0.3 times or less, preferably 0.2 times or less, with respect to the distance between the light emitting elements. With this arrangement, unevenness in the luminance can be reduced.

The reflecting members 33 preferably form an overall plate-shape in which a plurality of the reflecting members 33 are connected to each other, with a plurality of through-holes that allow arrangement of the light emitting devices. In FIG. 6, a schematic cross-sectional view that includes two light emitting devices is illustrated, but for example, as shown in the schematic top view of FIG. 7, several tens to several hundreds light emitting devices may be arranged in matrix.

EXAMPLES

Example 1

FIG. 1 and FIG. 2 are respectively a top view and a cross-sectional view of a light emitting device according to Example 1. As shown in FIG. 1, in Example 1, a light emitting element 12 is flip-chip mounted on the substrate 25, in which the light emitting element 12 is straddling the wiring parts 13a and 13b disposed on the upper surface of the base body 24, via the respective bonding members 18. Of the wiring parts 13a and 13b, regions that are not used to establish electrical connection is provided with a protective layer 15. The upper surface of the light emitting element 12 is provided with a reflecting layer 17.

The first light-transmissive member 16 is disposed to have a second surface 16b that is in contact with the lateral surfaces of the light emitting element 12, and to expose the reflecting layer 17 located on the upper surface of the light emitting element 12, tapering toward the substrate 25 as separating from the light emitting element 12. Further, a second light-transmissive member 20 is disposed to directly in contact with the second surface 16b of the first light-transmissive member 16 and the reflecting layer 17. The second light-transmissive member 20 has a circular shape in a top view, and having a curved surface. The second light-transmissive member 20 is formed in a convex shape with a height smaller than its radius and covering the light emitting element 12 and the first light-transmissive member 16.

In Example 1, the base body 24 is made of glass epoxy base material, the wiring parts 13a, 13b are made of a Cu material with a thickness of 35 μm, the protective layer 15 is made of an epoxy-based white solder resist and has light-reflecting properties.

The light emitting element 12 is a nitride-based blue LED with a peak emission wavelength of 450 nm, having a substantially square shape with a side of 600 μm and a thickness of 150 μm, with a dielectric multilayer film disposed as a reflecting layer 17 on the upper surface of the light emitting element 12.

In Example 1, the first light-transmissive member 16 is made of dimethyl silicone (refractive index 1.41), and the second light-transmissive member 20 is made of phenyl silicone (refractive index 1.50). In Example 1, the refractive index at 589 nm is shown, but at 450 nm, which is the emission wavelength of the light emitting element 12, the relationship of "a refractive index α of the first light-transmissive member 16<refractive index β of the second light-transmissive member 20" is still satisfied.

The second light-transmissive member 20 of Example 1 preferably does not have light scattering properties, but in order to provide thixotropic properties, a silica-based nano-filler material (average particle diameter of about 12 nm) that does not create scattering of light is added.

Comparative Example 1

As shown in FIG. 3, Comparative Example 1 is performed as in Example 1, except that the first light-transmissive member 16 is made of phenyl silicone (refractive index 1.50) and the second light-transmissive member 20 is made of dimethyl silicone (refractive index 1.41). The refractive indices satisfy a relationship of "a refractive index α of the first light-transmissive member 16>refractive index β of the second light-transmissive member 20".

Comparative Example 2

As shown in FIG. 4, Comparative Example 2 is performed as in Example 1, except that the first light-transmissive member 16 and the second light-transmissive member 20 are made of phenyl silicone (refractive index 1.50). The refractive indices satisfy a relationship of "a refractive index α of the first light-transmissive member 16=refractive index β of the second light-transmissive member 20".

Comparative Example 3

As shown in FIG. 4, Comparative Example 3 is performed as in Example 1, except that the first light-transmissive member 16 and the second light-transmissive member 20 are made of dimethyl silicone (refractive index 1.41). The refractive indices satisfy "refractive index α of the first light-transmissive member 16=refractive index β of the second light-transmissive member 20".

Results

Figure 8:
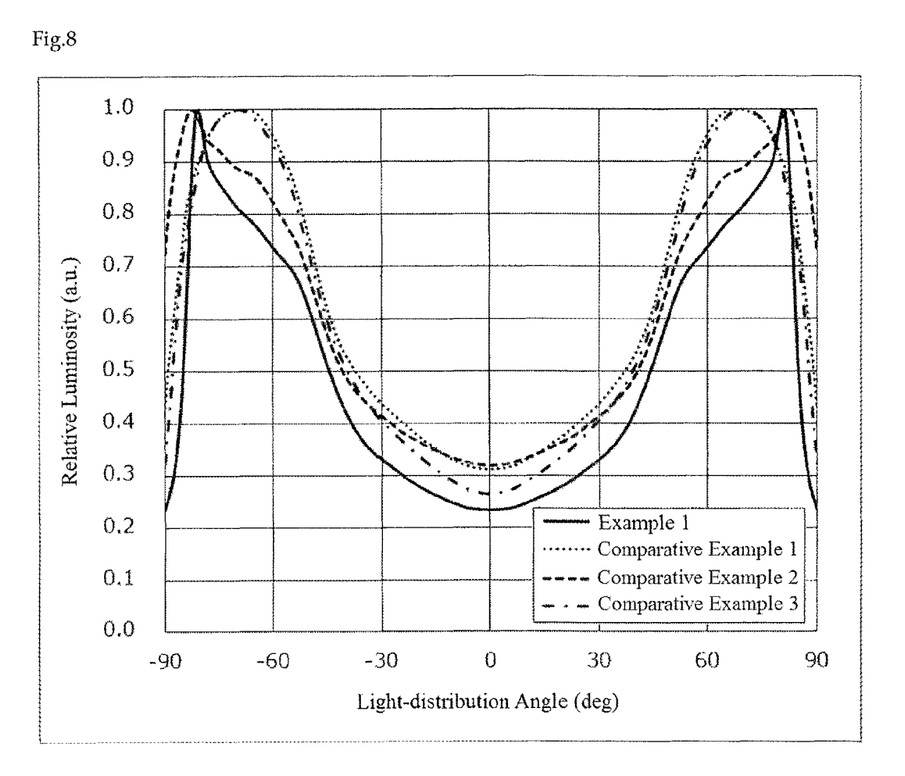
FIG. 8 is a graph showing light distributing properties of Example and Comparative Examples.

Light distributing properties of the light emitting devices according to Example 1, and Comparative Examples 1 to 3 are shown in FIG. 8.

The diagram shows that, in Example 1, where α<β, light emitted in a lateral direction is refracted in upward direction, which reduces the amount of light in a right-lateral direction, and accordingly, increases the peak height. With the increase in the peak height, the amount of light directly above the light emitting element, that is, the amount of light near 0° is relatively lowered. Accordingly, relative luminous intensity with respect to the peak luminous intensity in the substantially upward direction can be decreased compared to that in Comparative Examples 1 to 3, and desired light distributing properties can be obtained.

The light emitting devices can be used for the display devices such as backlights of liquid crystal displays and TV-screens, and lighting devices.

It is to be understood that although the present disclosure has been described with regard to example embodiments thereof, various other embodiments and variants may occur to those skilled in the art, which are within the scope and spirit of the disclosure, and such other embodiments and variants are intended to be covered by the following claims.

All publications, patent applications, and technical standards mentioned in this specification are herein incorporated by reference to the same extent as if each individual publication, patent application, or technical standard was specifically and individually indicated to be incorporated by reference.

What is claimed is:

1. A surface light emitting device comprising:
a substrate;
a plurality of light emitting devices disposed in a two-dimensional array on the substrate, each light emitting device comprising:
   a light emitting element having an upper surface and a lateral surface,
   a reflecting layer located on the upper surface of the light emitting element,
   a first light-transmissive member having a first surface in contact with the lateral surface of the light emitting element, and a second surface that is inclined toward the substrate in a direction outward from the light emitting element, and
   a second light-transmissive member in direct contact with the second surface of the first light-transmissive member and covering the light emitting element,
   wherein a refractive index of the first light-transmissive is smaller than a refractive index of the second light-transmissive member; and
a plurality of reflecting members disposed on the substrate, the plurality of reflecting members including:
   a first reflecting member extending in a first direction and arranged between a first of the light emitting devices and a second of the light emitting devices that are adjacent to each other in a second direction that is perpendicular to the first direction, and
   a second reflecting member extending in the second direction and arranged between the first of the light emitting devices and a third of the light emitting devices that are adjacent to each other in the first direction,
   wherein each reflecting member is configured to reflect light from the light emitting elements of the respective two adjacent light emitting devices, and each reflecting member is disposed in a region outward of the second light-transmissive members of the respective two adjacent light emitting devices.

2. The surface light emitting device according to claim 1, wherein each first light-transmissive member and each second light-transmissive member is made of a resin material.

3. The surface light emitting device according to claim 1, wherein each second light-transmissive member directly covers the substrate at a location outward of an outer periphery of each respective first light-transmissive member.

4. The surface light emitting device according to claim 1, wherein a surface of each second light-transmissive member is curved.

5. The surface light emitting device according to claim 1, wherein each second light-transmissive member has a circular shape in a top view, and a height of each second light-transmissive member is smaller than a radius of the circular shape.

6. The surface light emitting device according to claim 1, wherein each light emitting element is flip-chip-mounted on the substrate.

7. The surface light emitting device according to claim 1, wherein:
   the substrate comprises a wiring part located at an upper side of the substrate, and
   each light emitting element is electrically connected to the wiring part via a wire.

8. The surface light emitting device according to claim 1, wherein a height of each reflecting member is greater than a height of each respective second light-transmissive member.

9. The surface light emitting device according to claim 1, further comprising a light diffusing plate disposed over the light emitting devices and the reflecting members.

10. The surface light emitting device according to claim 1, further comprising a wavelength converting layer disposed over the light emitting devices and the reflecting members.

11. The surface light emitting device according to claim 1, wherein each of the one of more reflecting members comprises a first surface that extends downward and outward toward a first light emitting device of the respective two adjacent light emitting devices, and a second surface that extends downward and outward toward a second light emitting device of the respective two adjacent light emitting devices.

* * * * *

UNITED STATES PATENT AND TRADEMARK OFFICE
CERTIFICATE OF CORRECTION

PATENT NO. : 10,720,552 B2
APPLICATION NO. : 15/608791
DATED : July 21, 2020
INVENTOR(S) : Yuichi Yamada and Motokazu Yamada It is certified that error appears in the above-identified patent and that said Letters Patent is hereby corrected as shown below:

In the Claims

Claim 1, Column 11, Lines 23-25:
Please delete:
"wherein a refractive index of the first light-transmissive is smaller than a refractive index of the second light-transmissive member; and"
Please replace with:
"wherein a refractive index of the first light-transmissive member is smaller than a refractive index of the second light-transmissive member; and"

Signed and Sealed this
Twenty-second Day of September, 2020

Andrei Iancu
*Director of the United States Patent and Trademark Office*